(12) United States Patent
Jang et al.

(10) Patent No.: US 11,056,461 B2
(45) Date of Patent: Jul. 6, 2021

(54) METHOD OF MANUFACTURING FAN-OUT WAFER LEVEL PACKAGE

(71) Applicant: SAMSUNG ELECTRONICS CO., LTD., Suwon-si (KR)

(72) Inventors: Yeonho Jang, Goyang-si (KR);
Gwangjae Jeon, Hwaseong-si (KR);
Dongkyu Kim, Anyang-si (KR);
Jungho Park, Cheonan-si (KR);
Seokhyun Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/748,138

(22) Filed: Jan. 21, 2020

(65) Prior Publication Data
US 2021/0020600 A1    Jan. 21, 2021

(30) Foreign Application Priority Data
Jul. 18, 2019 (KR) .......................... 10-2019-0086739

(51) Int. Cl.
*H01L 21/56* (2006.01)
*H01L 23/00* (2006.01)
*H01L 21/78* (2006.01)

(52) U.S. Cl.
CPC ............ *H01L 24/94* (2013.01); *H01L 21/561* (2013.01); *H01L 21/568* (2013.01); *H01L 21/78* (2013.01); *H01L 24/19* (2013.01)

(58) Field of Classification Search
CPC ....... H01L 24/94; H01L 21/568; H01L 21/78; H01L 24/19; H01L 21/561

USPC ......................................................... 438/113
See application file for complete search history.

(56) References Cited

U.S. PATENT DOCUMENTS

| | | | |
|---|---|---|---|
| 8,441,136 B2* | 5/2013 | Chiou | H01L 25/50 257/790 |
| 8,778,738 B1 | 7/2014 | Lin et al. | |
| 9,698,121 B2 | 7/2017 | Mao et al. | |
| 9,735,113 B2* | 8/2017 | Chi | H01L 23/5389 |
| 9,786,586 B1 | 10/2017 | Shih | |
| 9,978,729 B2 | 5/2018 | Lin et al. | |
| 10,141,233 B2 | 11/2018 | Chen et al. | |
| 2011/0285007 A1 | 11/2011 | Chi et al. | |
| 2015/0214186 A1 | 7/2015 | Mao et al. | |
| 2016/0260693 A1 | 9/2016 | Lin et al. | |

(Continued)

*Primary Examiner* — Vu A Vu
(74) *Attorney, Agent, or Firm* — Sughrue Mion, PLLC (57) ABSTRACT

Provided is a method of manufacturing a semiconductor package including providing a carrier substrate, providing sacrificial layer on the carrier substrate, the sacrificial layer including a first sacrificial layer and a second sacrificial layer, providing a redistribution wiring layer on the sacrificial layer, providing a plurality of semiconductor chips on the redistribution wiring layer, providing a mold layer provided on the sacrificial layer, the redistribution wiring layer, and the plurality of semiconductor chips, detaching the first sacrificial layer from the second sacrificial layer, and dicing the second sacrificial layer, the redistribution wiring layer, and the mold layer, wherein a diameters of the first sacrificial layer and the second sacrificial layer are respectively less than a diameter of the carrier substrate, and a diameter of the mold layer is greater than the diameter of the redistribution wiring layer and less than the diameter of the first sacrificial layer.

19 Claims, 11 Drawing Sheets

(56) References Cited

U.S. PATENT DOCUMENTS

2017/0005023 A1  1/2017  Chen et al.
2019/0006196 A1  1/2019  Qu

* cited by examiner

METHOD OF MANUFACTURING FAN-OUT WAFER LEVEL PACKAGE

CROSS-REFERENCE TO THE RELATED APPLICATION

This application claims priority to Korean Patent Application No. 10-2018-0086739, filed on Jul. 18, 2019, in the Korean Intellectual Property Office, the disclosure of which is incorporated herein in its entirety by reference.

BACKGROUND

1. Field

Example embodiments of the present disclosure relate to a method of manufacturing a fan-out wafer level package by using a carrier substrate.

2. Description of the Related Art

As large-scale data processing and miniaturization of semiconductor products are needed, it is required to highly integrate and unitarily package semiconductor chips applied to the semiconductor products. Therefore, in the package field, fan-out wafer level packages which have a small size and implement a plurality of input/output (I/O) terminals have been developed. The fan out wafer level package can be implemented to have a plurality of I/O terminals while having a small size by rearranging the connection terminals outside the region where the semiconductor chip is disposed.

SUMMARY

One or more example embodiments provide a method of manufacturing a fan-out wafer level package using a carrier substrate, which detaches the carrier substrate from a package without a trim process and can reduce a defect occurring in a process of forming a package.

According to an aspect of an example embodiment, there is provided a method of manufacturing a semiconductor package, the method including providing a carrier substrate, providing sacrificial layer on the carrier substrate, the sacrificial layer including a first sacrificial layer and a second sacrificial layer, providing a redistribution wiring layer on the sacrificial layer, providing a plurality of semiconductor chips on the redistribution wiring layer, providing a mold layer provided on the sacrificial layer, the redistribution wiring layer, and the plurality of semiconductor chips on the carrier substrate to form a wafer level stack, detaching the first sacrificial layer from the second sacrificial layer to remove the first sacrificial layer and the carrier substrate from the wafer level stack, and dicing the second sacrificial layer, the redistribution wiring layer, and the mold layer to form a plurality of semiconductor packages respectively including at least one of the plurality of semiconductor chips, wherein a diameter of the first sacrificial layer and a diameter of the second sacrificial layer are respectively less than a diameter of the carrier substrate, wherein a diameter of the redistribution wiring layer is less than a diameter of the first sacrificial layer and a diameter of the second sacrificial layer, respectively, and wherein a diameter of the mold layer is greater than the diameter of the redistribution wiring layer and the diameter of the mold layer is less than the diameter of the first sacrificial layer.

According to another aspect of an example embodiment, there is provided a method of manufacturing a semiconductor package, the method including providing a sacrificial layer, a redistribution wiring layer, and a plurality of semiconductor chips provided on the redistribution wiring layer, which are sequentially stacked on a carrier substrate, providing a mold layer provided on the plurality of semiconductor chips to form a wafer level stack, removing the sacrificial layer and the carrier substrate from the wafer level stack to expose a lower surface of the redistribution wiring layer, and dicing the wafer level stack to form a semiconductor package including at least one of the plurality of semiconductor chips, wherein the mold layer is provided on an upper surface and a side surface of each of the plurality of semiconductor chips, an upper surface and a side surface of the redistribution wiring layer, and a portion of an upper surface of the sacrificial layer, and wherein the wafer level stack includes a cross-sectional surface having a stepped shape.

According to another aspect of an example embodiment, there is provided a method of manufacturing a semiconductor package, the method including providing a carrier substrate having a circular plate shape, providing a sacrificial layer on the carrier substrate, providing a redistribution wiring layer on the sacrificial layer, providing a plurality of semiconductor chips on the redistribution wiring layer, providing a mold layer provided on the plurality of semiconductor chips on the carrier substrate to form a wafer level stack, removing the sacrificial layer and the carrier substrate from the wafer level stack to expose a lower surface of the redistribution wiring layer, and dicing the wafer level stack to form a semiconductor package including at least one of the plurality of semiconductor chips, wherein the sacrificial layer includes a release layer and a barrier layer sequentially stacked, wherein the redistribution wiring layer includes a conductive layer electrically connected to the semiconductor package and an insulation layer provided on the conductive layer, wherein the conductive layer includes a lower pad provided on an upper surface of the sacrificial layer, a wiring layer provided on the lower pad, and a via connecting the lower pad to the wiring layer, wherein the mold layer contacts an upper surface of the redistribution wiring layer, an outer side surface of the redistribution wiring layer, and a portion of the upper surface of the sacrificial layer, wherein the wafer level stack has a cross-sectional surface having a stepped shape, and wherein a shortest distance between an outer side surface of the mold layer and an outer side surface of the carrier substrate is greater than a shortest distance between an outer side surface of the sacrificial layer and the outer side surface of the carrier substrate

BRIEF DESCRIPTION OF THE DRAWINGS

The above and/or other objects and will become apparent by describing in detail example embodiments thereof with reference to the accompanying drawings, of which:

FIGS. 1 to 12 and 16 to 19 are diagrams illustrate a method of manufacturing a fan-out wafer level package according to an example embodiment;

DETAILED DESCRIPTION OF THE EMBODIMENTS

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout. As used herein, the term "and/or" includes any and all combinations of one or more of the associated listed items.

Figure 4:
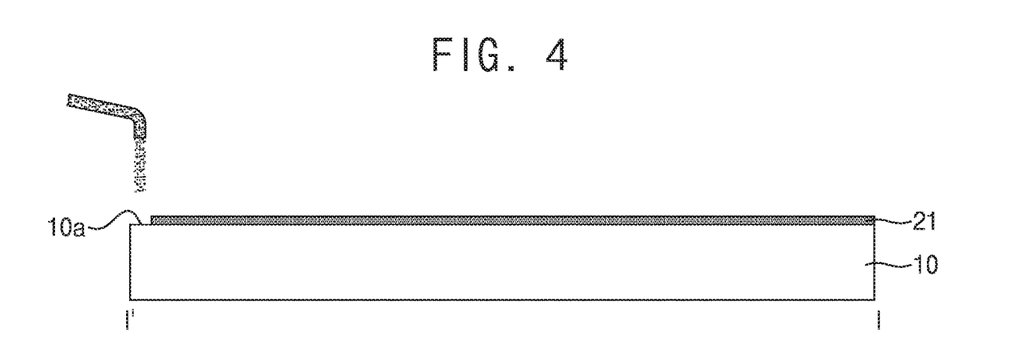
FIG. 4 is a cross-sectional view taken along line "I-I'" of FIG. 3.

FIGS. 1 to 12 and 16 to 19 are diagrams illustrating a method of manufacturing a fan-out wafer level package according to an example embodiment. FIGS. 1, 3, 7, 9, 11, and 17 are perspective views schematically illustrating examples of intermediate processes of a method of manufacturing a fan-out wafer level package according to an example embodiment. FIG. 2 is a cross-sectional view taken along line "I-I'" of FIG. 1. FIG. 4 is a cross-sectional view taken along line "I-I'" of FIG. 3. FIG. 8 is a cross-sectional view taken along line "I-I'" of FIG. 7. FIG. 10 is a cross-sectional view taken along line "I-I'" of FIG. 9. FIG. 12 is a cross-sectional view taken along line "I-I'" of FIG. 11. FIG. 18 is a cross-sectional view taken along line "II-II'" of FIG. 17.

Figure 1:
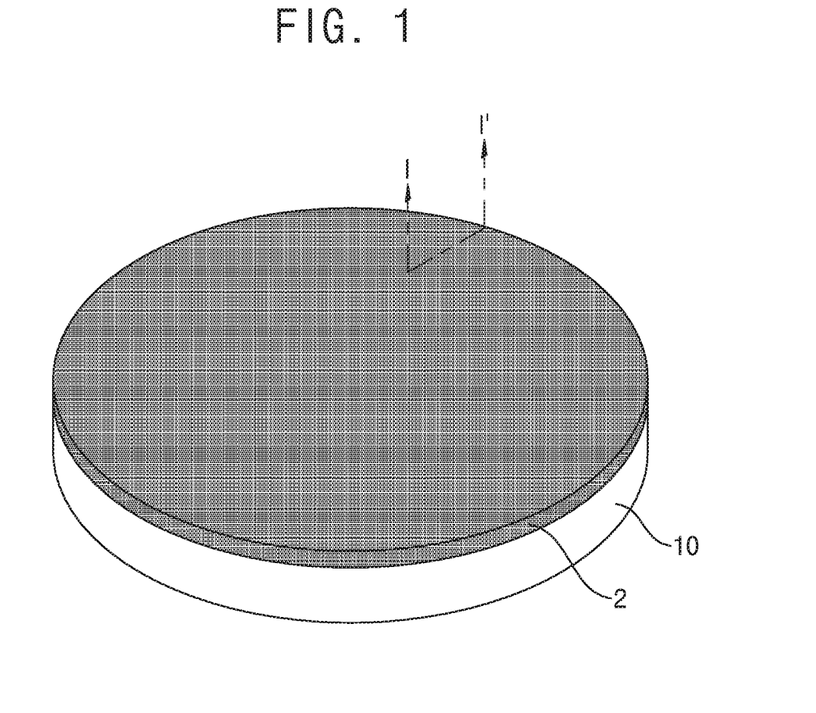
FIGS. 1, 3, 7, 9, 11, and 17 are perspective views schematically illustrating examples of intermediate processes of a method of manufacturing a fan-out wafer level package according to an example embodiment.
Figure 2:
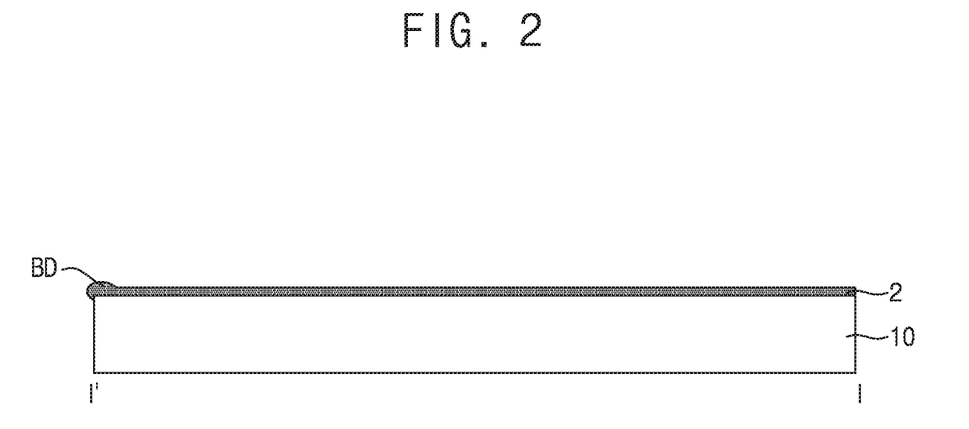
FIG. 2 is a cross-sectional view taken along line "I-I'" of FIG. 1.
Figure 3:
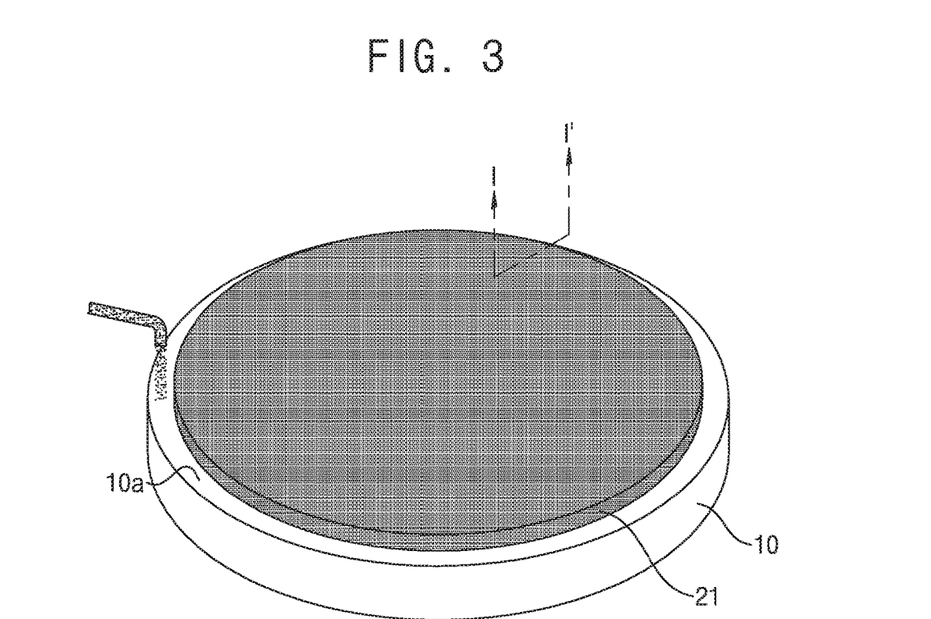

Referring to FIG. 1, a method of manufacturing a fan-out wafer level semiconductor package according to an example embodiment may include a process of providing a carrier substrate 10. The carrier substrate 10 may be a temporary carrier which is used to enable the fan-out wafer level package to be more easily manufactured. In an example embodiment, the carrier substrate 10 may include a material that is flatter than prepreg. For example, the carrier substrate 10 may be a glass substrate, a sapphire substrate, or a silicon (Si) substrate. The glass substrate may include amorphous solids including a glass component. For example, the carrier substrate 10 may be a circular panel, but is not limited thereto, and may be a tetragonal panel. The carrier substrate 10 may include a single layer or a multi-layer.

Referring to FIGS. 1 to 5, the method may include a process of forming a sacrificial layer 20 on the carrier substrate 10. The sacrificial layer 20 may include a plurality of layers, and for example, may include a first sacrificial layer 21 and a second sacrificial layer 23.

Referring to FIGS. 1 to 4, the first sacrificial layer 21 may be formed on the carrier substrate 10 to directly cover an upper surface 10a of the carrier substrate 10. A process of forming the first sacrificial layer 21 may include a process of removing an edge of the first sacrificial layer 21. The first sacrificial layer 21 may be a release layer. The release layer may be formed to facilitate a process of removing the carrier substrate 10.

The first sacrificial layer 21 may be formed through a spin coating process. A release member may be sprayed onto the upper surface 10a of the carrier substrate 10 by a spray apparatus through the spin coating process, and thus, a release film 2 may be formed. An edge of the release film 2 may be removed, and by heating and post-baking an edge-removed release film 2, the first sacrificial layer 21 may be formed. For example, the edge of the release film 2 may be removed through an edge bead removal (EBR) process or a wafer edge expose (WEE) process. In an example embodiment, since the release film 2 is formed through the spin coating process, a bead BD may be formed at an edge of the carrier substrate 10 by a surface tension. The bead BD may be removed through the EBR process or the WEE process. The edge of the release film 2 may be removed, and a portion of the upper surface 10a of the carrier substrate 10 may be exposed. For example, the first sacrificial layer 21 may include a polymer material, an ultraviolet (VU) film, or resin.

The first sacrificial layer 21 may have substantially the same circular plate shape as that of the carrier substrate 10 and may have a diameter which is less than that of the carrier substrate 10. The exposed portion of the upper surface 10a of the carrier substrate 10 may substantially have a ring shape in a top view.

Figure 5:
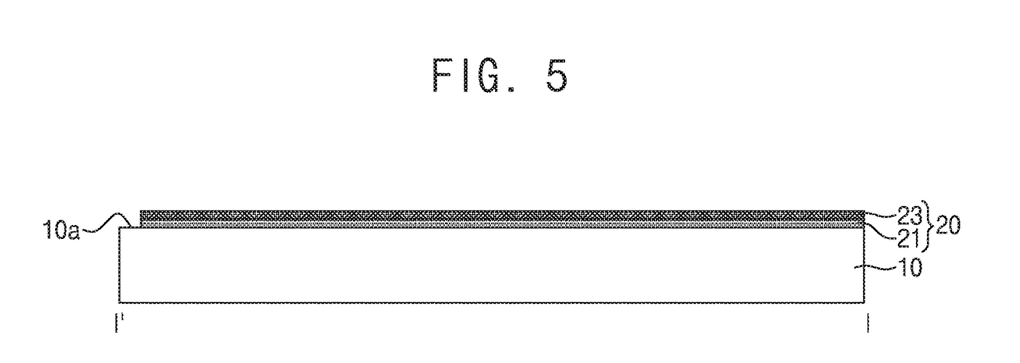

Referring to FIG. 5, the second sacrificial layer 23 covering an upper surface of the first sacrificial layer 21 may be formed on the first sacrificial layer 21. The second sacrificial layer 23 may be a barrier layer or a glue layer. The second sacrificial layer 23 may be formed through a physical vapor deposition (PVD) process, but is not limited thereto. The second sacrificial layer 23 may include titanium (Ti), copper (Cu), or an alloy thereof.

The second sacrificial layer 23 may be formed to have substantially the same circular plate shape as that of the first sacrificial layer 21 or the carrier substrate 10. The second sacrificial layer 23 may have a diameter which is less than the diameter of the carrier substrate 10 and may have substantially the same diameter as the diameter of the first sacrificial layer 21. Therefore, the second sacrificial layer 23 may fully cover the upper surface of the first sacrificial layer 21. The second sacrificial layer 23 may not cover the exposed portion of the upper surface 10a of the carrier substrate 10.

In an example embodiment, the second sacrificial layer 23 may have a diameter which is less than the diameter of the first sacrificial layer 21. An upper surface 21a of the edge of the first sacrificial layer 21 having a diameter greater than the diameter of the second sacrificial layer 23 may be exposed. For example, the exposed upper surface 21a of the first sacrificial layer 21 may have a width which is equal to or less than the exposed portion of the upper surface 10a of the carrier substrate 10, but is not limited thereto.

Figure 6:
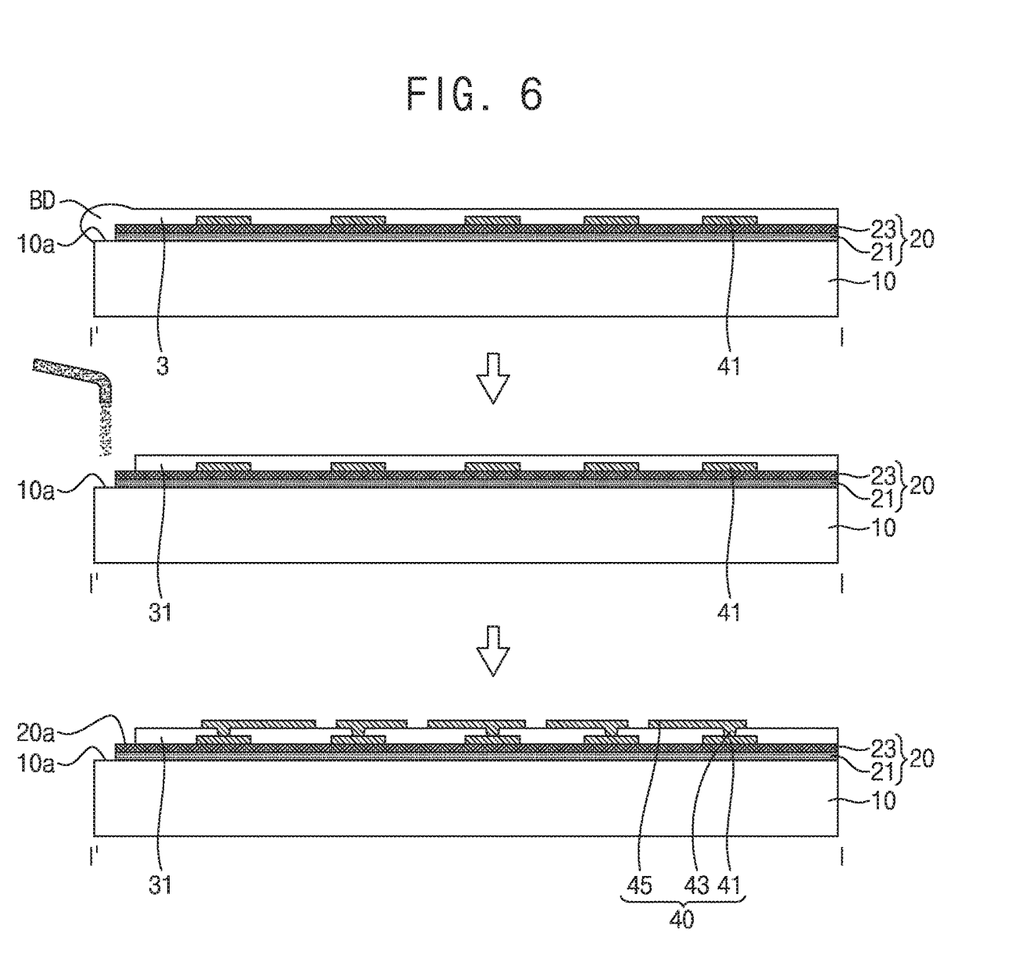
Figure 7:
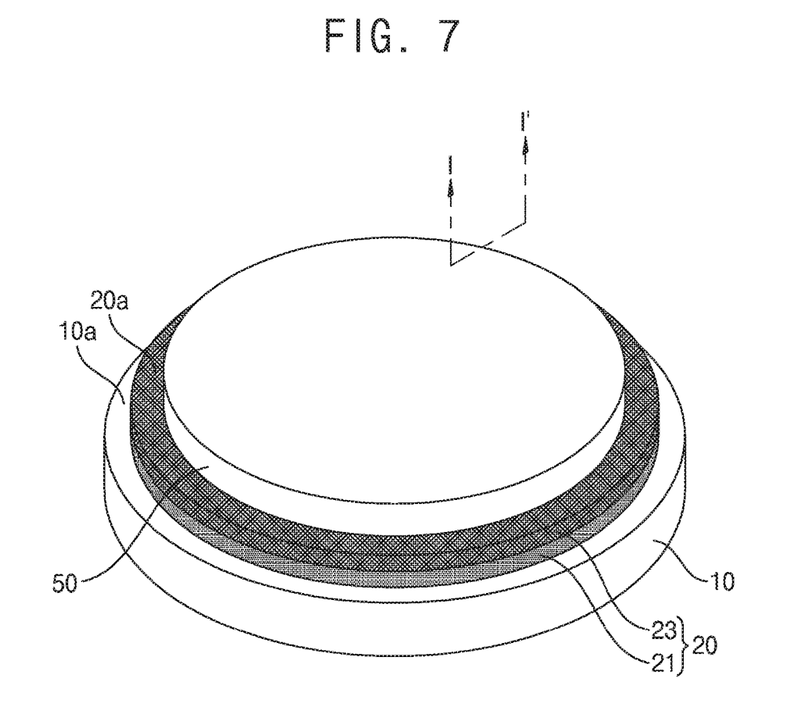
Figure 8:
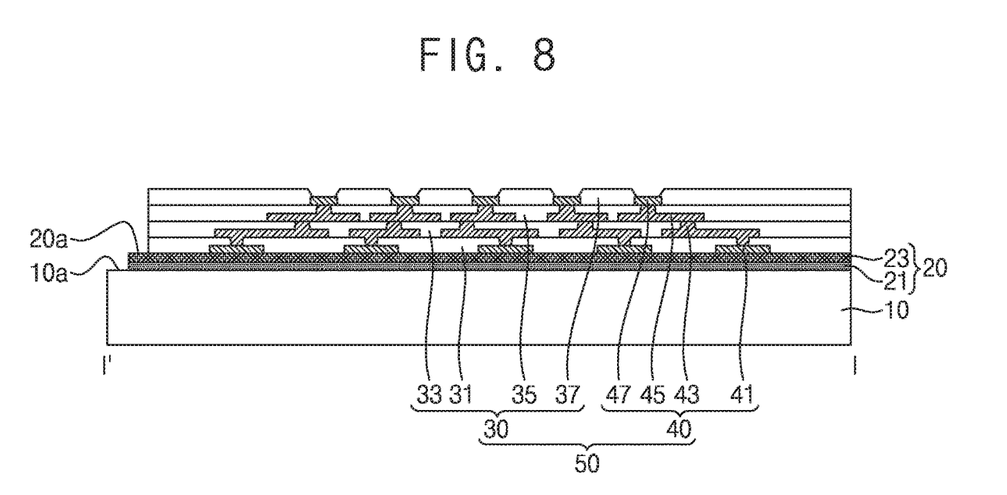
FIG. 8 is a cross-sectional view taken along line "I-I'" of FIG. 7.

Referring to FIGS. 6 to 8, the method may include a process of forming a redistribution wiring layer 50 on the carrier substrate 10. The redistribution wiring layer 50 may include an insulation layer 30 and a conductive layer 40. The insulation layer 30 may include a plurality of layers, and for example, may include a first insulation layer 31, a second insulation layer 33, a third insulation layer 35, and a fourth insulation layer 37. The conductive layer 40 may include a plurality of lower pads 41, a plurality of vias 43, a plurality of wiring layers 45, and a plurality of upper pads 47.

In an example embodiment, the insulation layer 30 may be formed through a spin coating process. An insulating material may be sprayed onto the carrier substrate 10 by a spray apparatus through the spin coating process, and thus, an insulation film 3 may be formed. The insulation film 3 may be formed to fully cover the sacrificial layer 20 and the carrier substrate 10. An edge of the insulation film 3 may be removed, and by heating and post-baking an edge-removed insulation film 3, the insulation layer 31 may be formed. For example, the edge of the insulation film 3 may be removed through an EBR process or a WEE process. In an example embodiment, since the insulation film 3 is formed through the spin coating process, the bead BD may be formed at the edge of the carrier substrate 10 by a surface tension. The edge of the insulation film 3 may be removed through the EBR process or the WEE process, and thus, the bead BD may be removed. The edge of the insulation film 3 may be removed, the upper surface 10a of the carrier substrate 10 may be exposed, and a portion of an upper surface 20a of the sacrificial layer 20 may be exposed. For example, the insulation layer 30 may include a photosensitive insulating material such as a photo imageable dielectric (PID) resin. In this case, the insulation layer 30 may be formed to be relatively thinner, and a fine pitch of a via may be obtained more easily.

In an example embodiment, the conductive layer 40 may be formed through an electroplating process. For example, the conductive layer 40 may include a seed metal layer.

Referring to FIG. 6, the first insulation layer 31 and the lower pads 41 may be formed on the sacrificial layer 20. The lower pads 41 may be formed by using an electroplating process, for example, a pulse plating process and/or a direct current (DC) plating process, or a deposition process. The first insulation layer 31 may be formed on the sacrificial layer 20. The first insulation layer 31 may be formed to cover and encapsulate the lower pads 41. The first insulation layer 31 may insulate the lower pads 41. The insulation film 3 may cover the sacrificial layer 20 and the lower pads 41, and the edge of the insulation film 3 may be removed through an EBR process, thereby forming the first insulation layer 31. An edge-removed insulation film 3 may be pre-baked. An opening portion may be formed in a pre-baked insulation film 3 through an exposure process and a development process. The insulation film 3 with the opening portion formed therein may be post-baked, and thus, the first insulation layer 31 may be formed.

A photoresist pattern may be formed on the first insulation layer 31. The photoresist pattern may expose a portion of an upper surface of the first insulation layer 31 and the lower pad 41. The seed metal layer may be formed on the photoresist pattern, the exposed portion of the upper surface of the first insulation layer 31, and the exposed lower pad 41. For example, the seed metal layer may include Cu, tungsten (W), Ti, tantalum (Ta), or aluminum (Al). The wiring layer 45 may be formed on the seed metal layer. The via 43 and the wiring layer 45 may be formed on the seed metal layer. The via 43 may be formed in the opening portion of the first insulation layer 31. The wiring layer 45 may be formed on an upper surface of the first insulation layer 31. The via 43 may connect the wiring layer 45 to the lower pad 41. The seed metal layer may be used as a current providing layer in forming the wiring layer 45. For example, the via 43 and the wiring layer 45 may each include Cu.

Subsequently, the conductive layer 40 disposed on the second to fourth insulation layers 33, 35, and 37 and the second insulation layer 33 may be formed by using the same method as the above description, and thus, the redistribution wiring layer 50 illustrated in FIGS. 7 and 8 may be formed. Materials of the first to fourth insulation layers 31, 33, 35, and 37 may be the same, or may be different. The first to fourth insulation layers 31, 33, 35, and 37 may be provided integrally based on a process, and thus, a boundary between adjacent insulation layers may be unclear.

Referring to FIGS. 7 and 8, the redistribution wiring layer 50 may have substantially the same circular plate shape as that of the carrier substrate 10 and may have a diameter which is less than that of the sacrificial layer 20. The insulation layer 30 of the redistribution wiring layer 50 may have a diameter which is less than that of the sacrificial layer 20. The upper surface 20a of an edge of the sacrificial layer 20 having a diameter greater than that of the insulation layer 30 may be exposed. The exposed upper surface 20a of the sacrificial layer 20 may substantially have a ring shape in a top view. An upper surface of the upper pad 47 may be exposed at an upper surface of the redistribution wiring layer 50.

Figure 9:
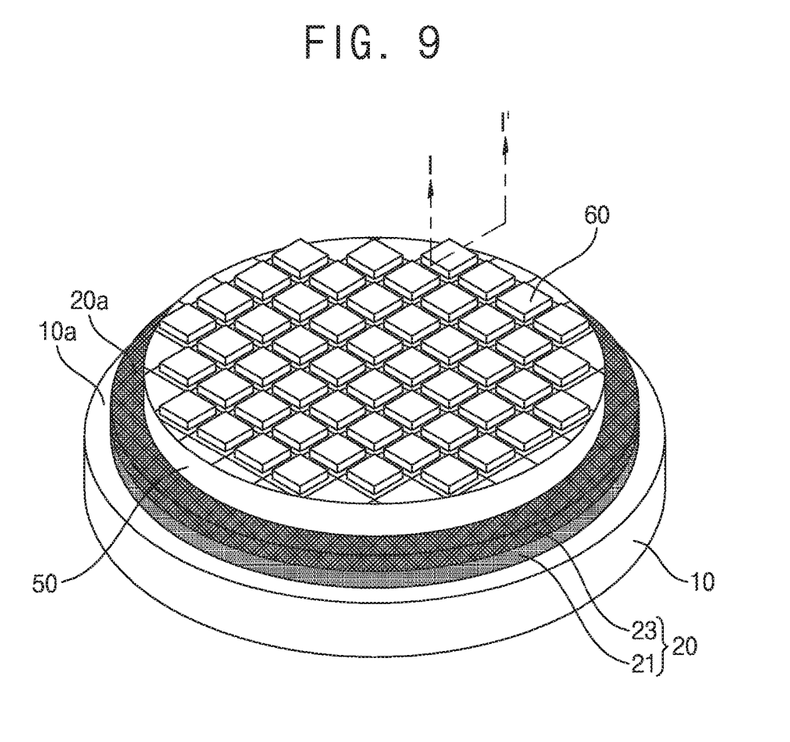
Figure 10:
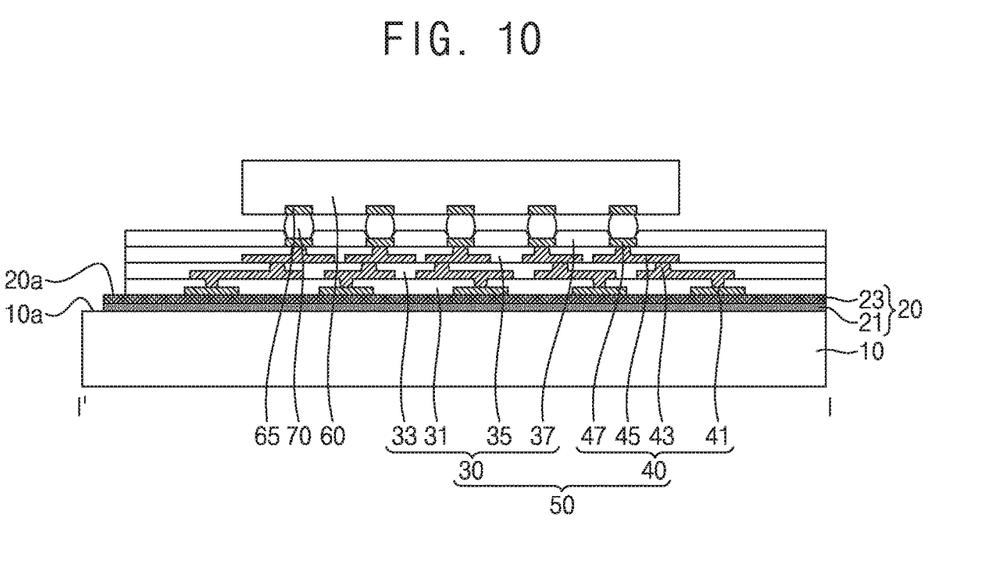
FIG. 10 is a cross-sectional view taken along line "I-I'" of FIG. 9.

Referring to FIGS. 9 and 10, the method may include a process of mounting a plurality of semiconductor chips on the redistribution wiring layer 50. As illustrated in FIG. 9, the plurality of semiconductor chips 60 may be regularly arranged on the redistribution wiring layer 50, but are not limited thereto. Each of the plurality of semiconductor chips 60 may include a plurality of chip pads 65. A bump 70 may be disposed in each of the plurality of chip pads 65, and the semiconductor chips 60 may be mounted on the redistribution layer 50 through the bump 70 by using a flip-chip bonding process. The plurality of chip pads 65 may each include a memory semiconductor chip or a logic semiconductor chip. For example, the plurality of semiconductor chips 60 may each include at least one of dynamic random access memory (DRAM), static random access memory (SRAM), flash memory, electrically erasable programmable read-only memory (EEPROM), phase change random access memory (PRAM), magnetic random access memory (MRAM), resistance random access memory (RRAM), application specific integrated circuits (ASICs), an application processor (AP), and MODEM.

Figure 11:
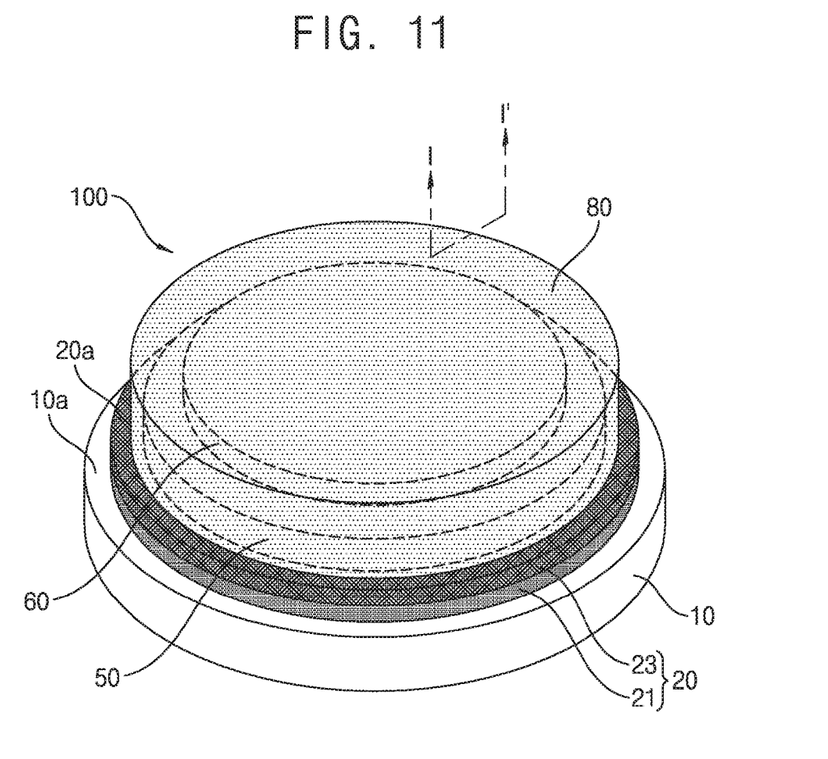
Figure 12:
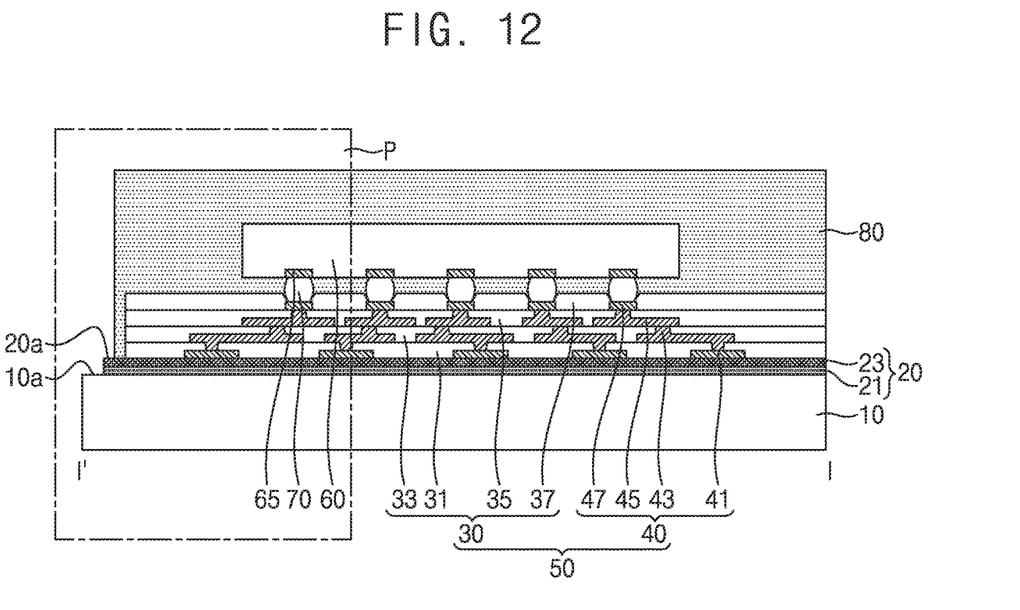
FIG. 12 is a cross-sectional view taken along line "I-I'" of FIG. 11.

Referring to FIGS. 11 and 12, the method may include a process of forming a mold layer 80 covering and encapsulating the plurality of semiconductor chips 60 to form a wafer level stack 100. The mold layer 80 may be formed on the carrier substrate 10 to cover and encapsulate the sacrificial layer 20, the redistribution wiring layer 50, and the plurality of semiconductor chips 60, and may directly cover an upper surface and a side surface of each of the plurality of semiconductor chips 60. The mold layer 80 may be formed to seal the plurality of semiconductor chips 60 and may protect the plurality of semiconductor chips 60 from the outside. For example, the mold layer 80 may be formed by using a process of injecting a liquid epoxy molding compound (EMC) into a mold to solidify the liquid EMC, a process of laminating and solidifying a film-type resin, or a molded underfill (MUF) process. For example, the mold layer 80 may include an epoxy-based material, a thermo-curable material, a thermoplastic material, a ultra violet (UV) treatment material, and/or the like.

According to an example embodiment, the wafer level stack 100 with the mold layer 80 formed therein may include a first stepped surface 10a may be provided at the edge of the carrier substrate 10 and a second stepped surface 20a may be provided at an edge of the sacrificial layer 20. The first stepped surface 10a and the second stepped surface 20a may form a cross-sectional surface having a step height and a stepped shape. The second stepped surface 20a may be disposed at a higher level than the first stepped surface 10a and may be disposed more inward toward the center of the carrier substrate 10 than the first stepped surface 10a with respect to the carrier substrate 10 in a top view. The exposed upper surface 10a of the edge of the carrier substrate 10 illustrated in FIGS. 11 and 12 may be the first stepped surface 10a, and the exposed upper surface 20a of the sacrificial layer 20 may be the second stepped surface 20a.

In an example embodiment, the mold layer 80 may have a diameter which is greater than that of redistribution wiring layer 50 and less than that of the sacrificial layer 20. Therefore, the mold layer 80 may cover an upper surface and a side surface of the redistribution wiring layer 50 and a portion of the exposed upper surface 20a (the second stepped surface) of the sacrificial layer 20. The mold layer 80 may not fully cover the exposed upper surface 20a of the sacrificial layer 20 as illustrated in FIG. 12, and a portion of the exposed upper surface 20a of the edge of the sacrificial layer 20 may be exposed. For example, the mold layer 80 may cover an area corresponding to 1% to 99% of an area of the exposed upper surface 20a of the sacrificial layer 20.

Figure 13:
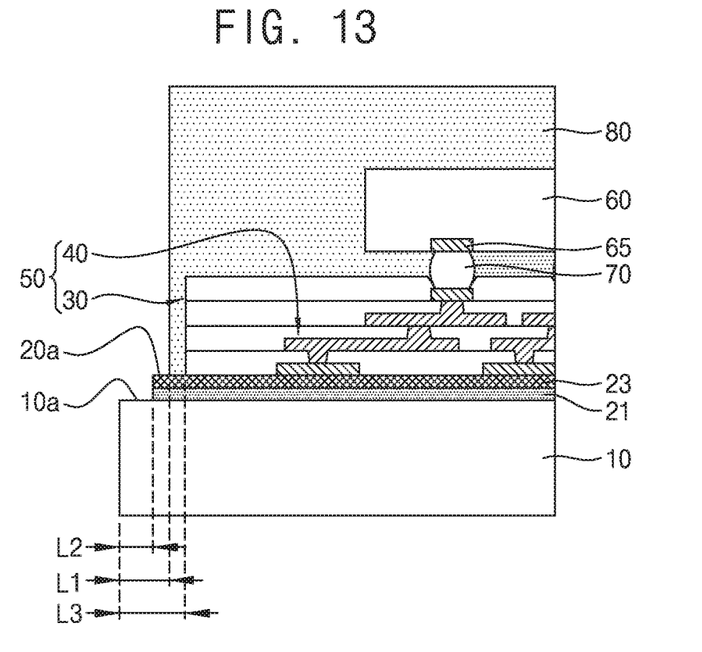
FIGS. 13 to 15 are enlarged cross-sectional views of a region P of FIG. 12 according to example embodiments.
Figure 14:
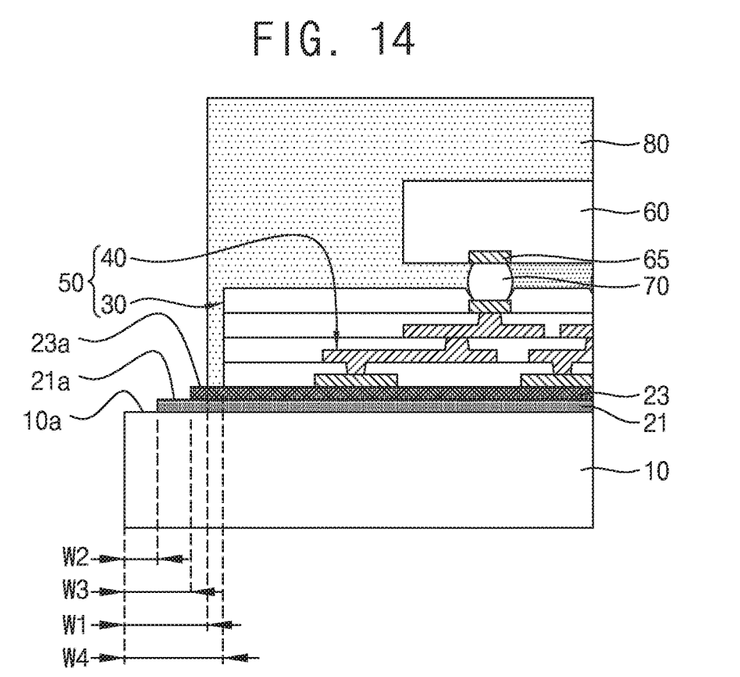
Figure 15:
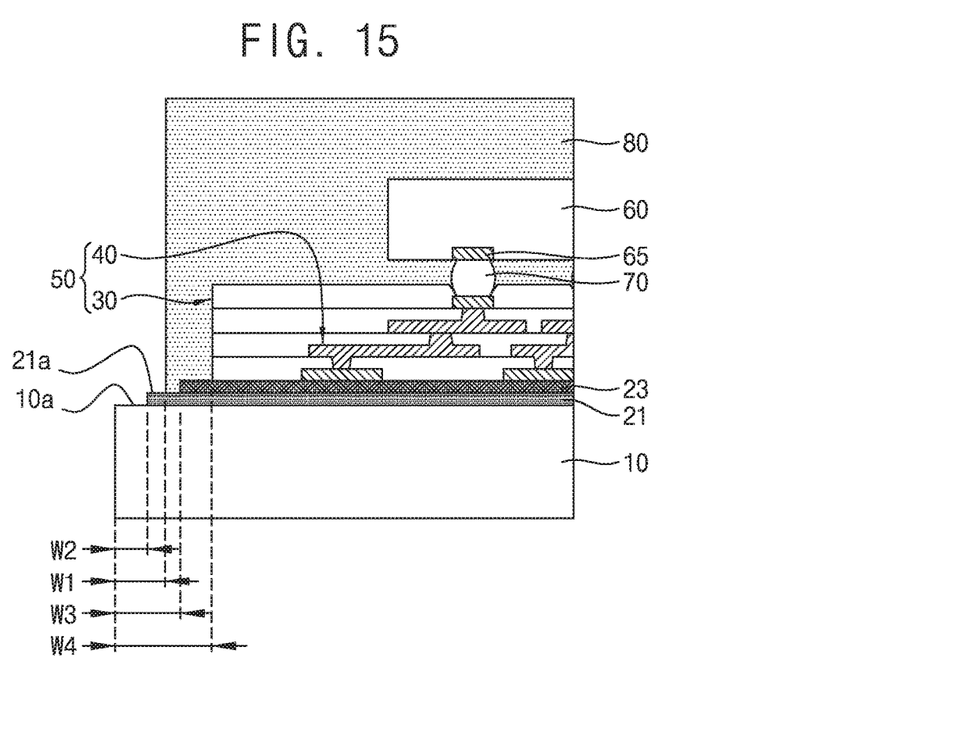

FIGS. 13 to 15 are enlarged cross-sectional views of a region P of FIG. 12 according to example embodiments.

Referring to FIG. 13, a shortest distance L1 between an outer side surface of the mold layer 80 and an outer side surface of the carrier substrate 10 may be greater than a shortest distance L2 between an outer side surface of the sacrificial layer 20 and the outer side surface of the carrier substrate 10. The shortest distance L1 between the outer side surface of the mold layer 80 and the outer side surface of the carrier substrate 10 may be less than a shortest distance L3 between an outer side surface of the redistribution wiring layer 50 and the outer side surface of the carrier substrate 10.

Referring to FIG. 14, by using the same method as descriptions given above with reference to FIGS. 1 to 12, the redistribution wiring layer 50, the plurality of semiconductor chips 60, and the mold layer 80 may be formed on the second sacrificial layer 23, and thus, the wafer level stack 100 may be formed. In an example embodiment, the first sacrificial layer 21 may be formed to have a diameter which is less than that of the carrier substrate 10 and greater than that of the second sacrificial layer 23. The redistribution wiring layer 50 including the insulation layer 30 and the conductive layer 40 may be formed on the second sacrificial layer 23. A process of forming the insulation layer 30 may include a process of forming an insulation film covering the carrier substrate 10, the first sacrificial layer 21, and the second sacrificial layer 23 and a process of removing an edge of the insulation film. Since the edge of the insulation film is removed, an upper surface of an edge of the carrier substrate 10, an upper surface of the edge of the first sacrificial layer 21, and an upper surface of an edge of the second sacrificial layer 23 may be exposed. The plurality of semiconductor chips 60 may be mounted on the redistribution wiring layer 50, the mold layer 80 covering the plurality of semiconductor chips 60 may be formed, and thus, a wafer level stack may be formed. The wafer level stack with the mold layer 80 formed therein may include a first stepped surface 10a provided at an edge of the carrier substrate 10 that is exposed, a second stepped surface 21a provided at an edge of the first sacrificial layer 21 that is exposed, and a third stepped surface 23a provided at an edge of the second sacrificial layer 23 that is exposed. The first stepped surface 10a, the second stepped surface 21a, and the third stepped surface 23a may form a cross-sectional surface having a step height and a stepped shape. The second stepped surface 21a may be disposed at a higher level than the first stepped surface 10a and may be disposed more inward toward the center of the carrier substrate 10 than the first stepped surface 10a with respect to the carrier substrate 10 in a top view. The third stepped surface 23a may be disposed at a higher level than the second stepped surface 21a and may be disposed more inward toward the center of the carrier substrate 10 than the second stepped surface 21a with respect to the carrier substrate 10 in a top view. An exposed upper surface 10a of an edge of the carrier substrate 10 illustrated in FIG. 14 may be the first stepped surface 10a, an exposed upper surface of the first sacrificial layer 21 may be the second stepped surface 21a, and an exposed upper surface of the second sacrificial layer 23 may be the third stepped surface 23a.

When the first sacrificial layer 21 is formed to have a diameter which is less than that of the carrier substrate 10 and greater than that of the second sacrificial layer 23, a shortest distance W2 between an outer side surface of the first sacrificial layer 21 and the outer side surface of the carrier substrate 10 may be less than a shortest distance W3 between an outer side surface of the second sacrificial layer 23 and the outer side surface of the carrier substrate 10. In an example embodiment, the mold layer 80 may be formed so that a shortest distance W1 between the outer side surface of the mold layer 80 and the outer side surface of the carrier substrate 10 is greater than a shortest distance W3 between the outer side surface of the second sacrificial layer 23 and the outer side surface of the carrier substrate 10 and is less than a shortest distance W4 between the outer side surface of the redistribution wiring layer 50 and the outer side surface of the carrier substrate 10.

Referring to FIG. 15, in an example embodiment, the first sacrificial layer 21 may be formed to have a diameter which is less than that of the carrier substrate 10 and greater than that of the second sacrificial layer 23, and the mold layer 80 may be formed to have a diameter which is less than that of the first sacrificial layer 21 and greater than that of the second sacrificial layer 23. Therefore, the mold layer 80 may be formed to cover and encapsulate the second sacrificial layer 23, the plurality of semiconductor chips 60, and a portion of the upper surface of the first sacrificial layer 21.

When the first sacrificial layer 21 is formed to have a diameter which is less than that of the carrier substrate 10 and greater than that of the second sacrificial layer 23, the shortest distance W1 between the outer side surface of the mold layer 80 and the outer side surface of the carrier substrate 10 may be greater than the shortest distance W2 between the outer side surface of the first sacrificial layer 21 and the outer side surface of the carrier substrate 10 and may be less than the shortest distance W3 between the outer side surface of the second sacrificial layer 23 and the outer side surface of the carrier substrate 10.

Unlike the illustrations of FIGS. 12 to 15, when the mold layer 80 is disposed on the redistribution wiring layer 50 to have a diameter which is less than that of the redistribution wiring layer 50, delamination may occur between the redistribution wiring layer 50 and the mold layer 80 in a process of manufacturing a package, causing problems such as the reductions in yield rate and reliability of semiconductor packages. Also, in a case where the mold layer 80 covers up to the carrier substrate 10 in addition to covering the redistribution wiring layer 50, the mold layer 80 may be permanently attached on the carrier substrate 10, and thus, a trim process may be needed for removing the carrier substrate 10. When the trim process is performed, the carrier substrate 10 may not be reused. As illustrated in FIGS. 12 to 15, according to example embodiments, when the mold layer 80 is be formed to cover a side surface of the redistribution wiring layer 50, and contact only the sacrificial layer 20 without contacting the carrier substrate 10, a problem such as delamination may be prevented or reduced and the carrier substrate 10 may be reused.

Figure 16:
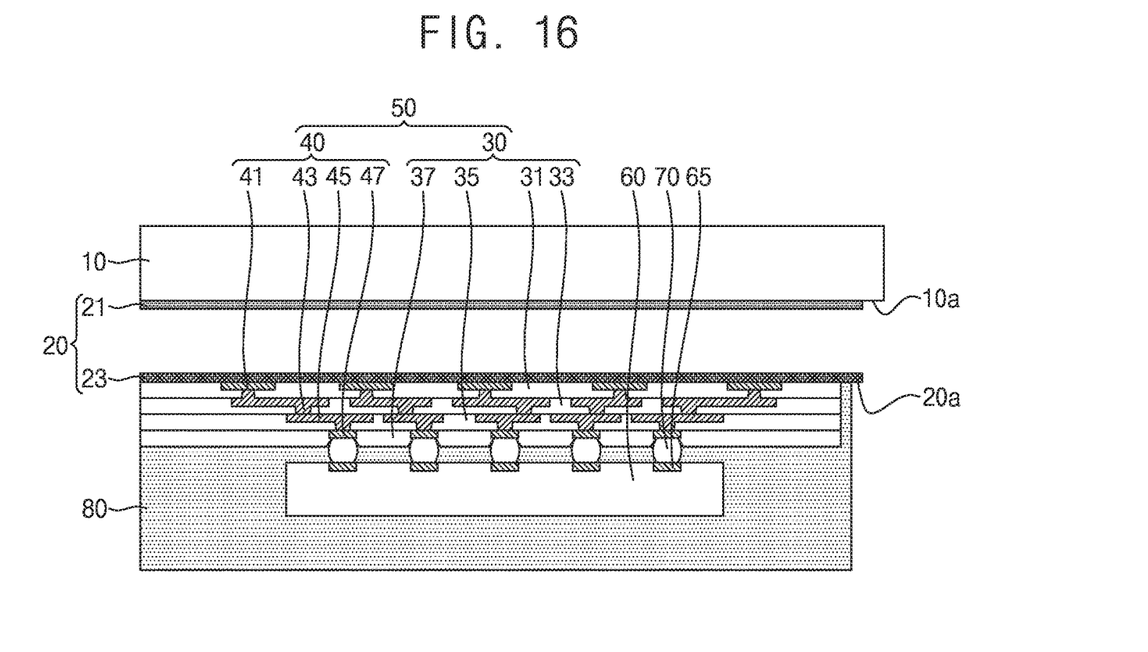

Referring to FIG. 16, the method may include a process of removing the sacrificial layer 20 and the carrier substrate 10 from the wafer level stack 100. The process of removing the sacrificial layer 20 and the carrier substrate 10 may include a process of detaching the release layer 21, which is the first sacrificial layer 21, from the second sacrificial layer 23, which is the barrier layer 23. For example, a laser may be irradiated toward a lower surface of the carrier substrate 10 and may reach the release layer 21, and thus, a material of the release layer 21 may be deformed, thereby removing the release layer 21. For example, the laser may include an excimer laser, but is not limited thereto. A material of the laser-irradiated release layer 21 may be deformed, and due to the deformation, an adhesive force may be weakened. Therefore, the release layer 21 may be detached from the barrier layer 23. As the release layer 21 is detached from the barrier layer 23, the carrier substrate 10 attached on the release layer 21 may be removed from the wafer level stack 100.

In an example embodiment, the process of removing the sacrificial layer 20 and the carrier substrate 10 from the wafer level stack 100 may include a process of removing the barrier layer 23. Since the release layer 21 is detached from the barrier layer 23, a lower surface of the barrier layer 23 may be exposed, and the barrier layer 23 including the exposed lower surface may be removed through an etch process. The barrier layer 23 may be removed, and a lower surface of each of the redistribution wiring layer 50 and the mold layer 80 may be exposed. For example, a lower surface of the first insulation layer 31 and a lower surface of the lower pad 41 may be exposed.

In an example embodiment, the method may further include a process of removing a residual material of the release layer 21 remaining on the lower surface of the barrier layer 23 before removing the barrier layer 23. For example, after the barrier layer 23 is detached from the release layer 21, a portion of the release layer 21 may remain as a residual material on the lower surface of the barrier layer 23. Therefore, the residual material of the release layer 21 may be completely removed through a plasma descum process. The barrier layer 23 may protect the redistribution wiring layer 50 and the mold layer 80 in a process of performing the plasma descum process.

Figure 17:
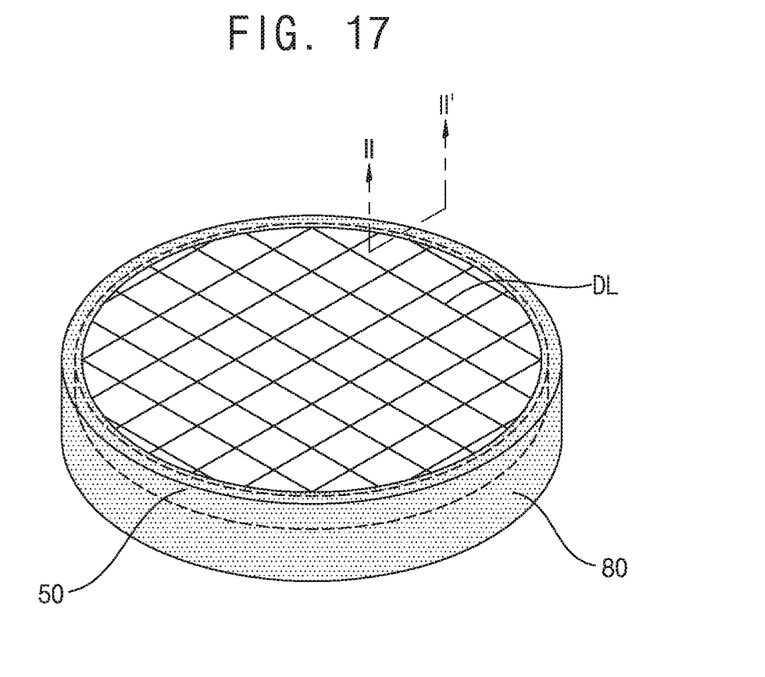
Figure 18:
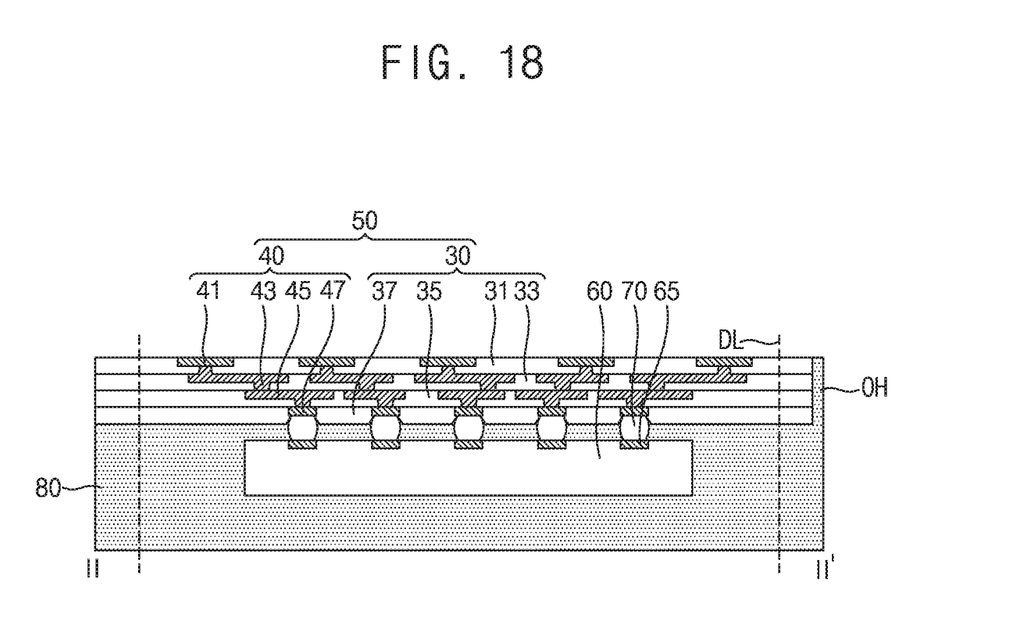
FIG. 18 is a cross-sectional view taken along line "II-II'" of FIG. 17.
Figure 19:
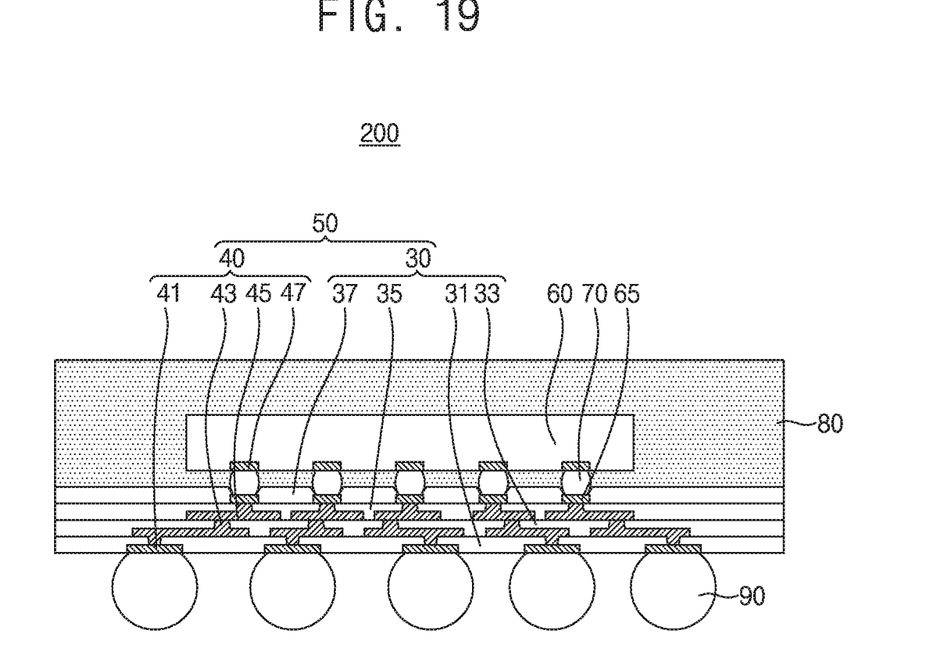

Referring to FIGS. 17 to 19, the method may further include a process of dicing the wafer level stack 100 to form an individualized plurality of semiconductor packages 200. Each of the individualized plurality of semiconductor packages 200 may be formed to include at least one of the plurality of semiconductor chips.

The plurality of semiconductor packages 200 may be formed by cutting the insulation layer 30 and the mold layer 80 of the wafer level stack 100 along a pre-cut line DL. The pre-cut line DL may be formed such that one semiconductor package includes at least one semiconductor chip 60. When dicing is performed along the pre-cut line DL, the redistribution wiring layer 50 (the insulation layer 30) and the mold layer 80 of each of the individualized plurality of semiconductor packages 200 may have the same planar area. In a semiconductor package formed at an edge of the wafer level stack 100, the redistribution wiring layer 50 (the insulation layer 30) and the mold layer 80 may have the same planar area. However, embodiments are not limited thereto, and in a semiconductor package formed at the edge of the wafer level stack 100, a planar area of the mold layer 80 may be greater than that of the redistribution wiring layer 50 and an overhang OH of the mold layer 80 covering a side surface of the redistribution wiring layer 50 may remain. The lower pad 41 may be exposed at a lower surface of each of the semiconductor packages 200, and a solder ball 90 may be formed on the lower pad 41. Each of the semiconductor packages 200 may be mounted on a main board through the solder ball 90.

Figure 20:
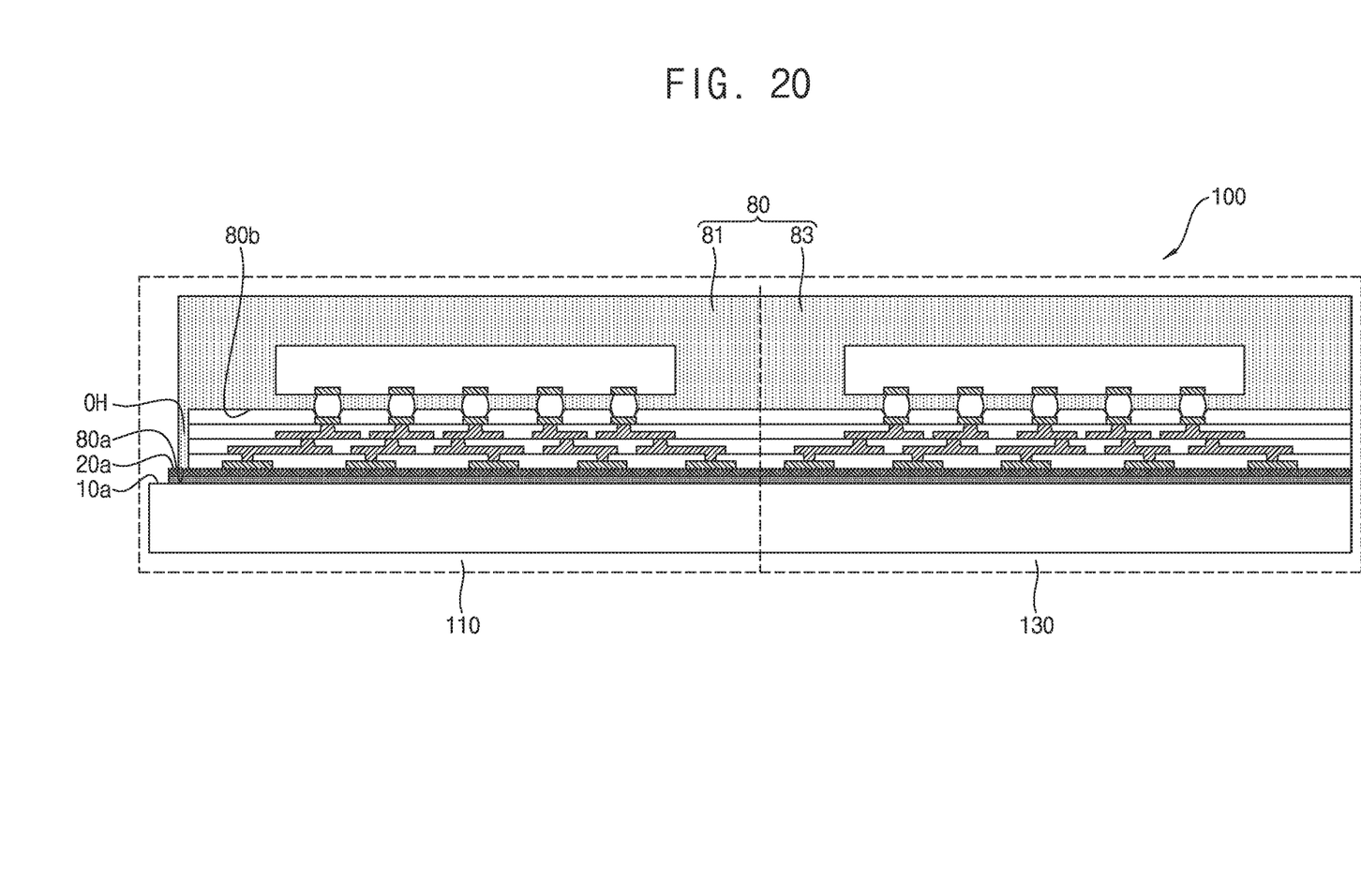
FIG. 20 is a cross-sectional view illustrating a method of manufacturing a fan-out wafer level package according to an example embodiment.

FIG. 20 is a cross-sectional view for describing a method of manufacturing a fan-out wafer level package according to an example embodiment. FIG. 20 illustrates a cross-sectional view of a wafer level package which is cut to include two adjacent semiconductor chips in FIG. 11.

Referring to FIG. 20, a process of forming the wafer level stack 100 may include a process of forming a plurality of package structures 110 and 130 including at least one of the plurality of semiconductor chips 60. In an example embodiment, the plurality of package structures 110 and 130 may include an outer package structure 110 and an inner package structure 130.

The outer package structure 110 may be disposed adjacent to an edge of the wafer level stack 100. The outer package structure 110 may include a cross-sectional surface having a stepped shape and may include a first stepped surface 10a and a second stepped surface 20a. The outer package structure 110 may include an outer mold layer 81 including a lower surface having a step height in the mold layer 80 of the wafer level stack 100. The outer mold layer 81 may include an overhang OH covering a side surface of the redistribution wiring layer 50.

The inner package structure 130 may be disposed more inward toward the center of the carrier substrate 10 than the outer package structure 110 in the wafer level stack 100. That is, the inner package structure 130 may be disposed farther away from an outer side surface of the carrier substrate 10 than the outer package structure 110.

The inner package structure 130 may include an inner mold layer 83 including a lower surface having a uniform level. The lower surface of the inner mold layer 83 may correspond to a level of an upper surface of the insulation layer 30.

In the fan-out wafer level package manufacturing method according to the example embodiments, since a mold layer covering a semiconductor chip covers a redistribution wiring layer without being attached on a carrier substrate, the carrier substrate may be detached from a package without a trim process, and thus, the cost may be reduced by reusing the carrier substrate. Further, delamination occurring between the mold layer and the redistribution wiring layer may be prevented or reduced to reduce a package defect rate.

While example embodiments have been described with reference to the figures, it will be understood by those of ordinary skill in the art that various changes in form and details may be made therein without departing from the spirit and scope as defined by the following claims.

What is claimed is:

1. A method of manufacturing a semiconductor package, the method comprising:
 providing a carrier substrate;
 providing sacrificial layer on the carrier substrate, the sacrificial layer comprising a first sacrificial layer and a second sacrificial layer;
 providing a redistribution wiring layer on the sacrificial layer;

providing a plurality of semiconductor chips on the redistribution wiring layer;
providing a mold layer provided on the sacrificial layer, the redistribution wiring layer, and the plurality of semiconductor chips on the carrier substrate to form a wafer level stack;
detaching the first sacrificial layer from the second sacrificial layer to remove the first sacrificial layer and the carrier substrate from the wafer level stack; and
dicing the second sacrificial layer, the redistribution wiring layer, and the mold layer to form a plurality of semiconductor packages respectively comprising at least one of the plurality of semiconductor chips,
wherein a diameter of the first sacrificial layer and a diameter of the second sacrificial layer are respectively less than a diameter of the carrier substrate,
wherein a diameter of the redistribution wiring layer is less than each of a diameter of the first sacrificial layer and a diameter of the second sacrificial layer,
wherein a diameter of the mold layer is greater than the diameter of the redistribution wiring layer, and the diameter of the mold layer is less than the diameter of the first sacrificial layer, and
wherein the method further comprises prior to the forming of the plurality of semiconductor packages, removing the second sacrificial layer to expose a lower surface of the redistribution wiring layer and a lower surface of the mold layer.

2. The method of claim 1, wherein the providing of the first sacrificial layer and the second sacrificial layer comprises:
providing the first sacrificial layer directly on the carrier substrate; and
providing the second sacrificial layer on the first sacrificial layer opposite to the carrier substrate, the second sacrificial layer comprising titanium and copper.

3. The method of claim 1, wherein the providing of the first sacrificial layer comprises providing a release film on the carrier substrate and removing an edge of the release film to expose an upper surface of an edge of the carrier substrate.

4. The method of claim 1, wherein the providing of the redistribution wiring layer comprises:
providing a conductive layer on the second sacrificial layer; and
providing an insulation layer provided on the carrier substrate, the second sacrificial layer, and the conductive layer, the insulation layer comprising a photo imageable dielectric (PID).

5. The method of claim 4, wherein the diameter of the first sacrificial layer and the diameter of the second sacrificial layer are equal.

6. The method of claim 5, wherein the providing of the redistribution wiring layer comprises removing an edge of the insulation layer to expose the upper surface of the edge of the carrier substrate and an upper surface of an edge of the second sacrificial layer, respectively.

7. The method of claim 6, wherein the mold layer is provided to cover an area corresponding to at least 1% to 99% of an area of the exposed upper surface of the edge of the second sacrificial layer.

8. The method of claim 4, wherein the diameter of the first sacrificial layer is greater than the diameter of the second sacrificial layer, and
wherein the providing of the insulation layer comprises forming an insulation film on the second sacrificial layer and removing an edge of the insulation film to expose the upper surface of the edge of the carrier substrate, an upper surface of an edge of the first sacrificial layer, and an upper surface of an edge of the second sacrificial layer.

9. A method of manufacturing a semiconductor package, the method comprising:
providing a sacrificial layer, a redistribution wiring layer, and a plurality of semiconductor chips provided on the redistribution wiring layer, which are sequentially stacked on a carrier substrate;
providing a mold layer provided on the plurality of semiconductor chips to form a wafer level stack;
removing the sacrificial layer and the carrier substrate from the wafer level stack to expose a lower surface of the redistribution wiring layer; and
dicing the wafer level stack to form the semiconductor package comprising at least one of the plurality of semiconductor chips,
wherein the mold layer is provided on an upper surface and a side surface of each of the plurality of semiconductor chips, an upper surface and a side surface of the redistribution wiring layer, and a portion of an upper surface of the sacrificial layer,
wherein the wafer level stack comprises a cross-sectional surface having a stepped shape, and
wherein the providing of the redistribution wiring layer comprises:
providing a conductive layer on the sacrificial layer; and
providing an insulation layer provided on the carrier substrate, the sacrificial layer, and the conductive layer, the insulation layer comprising a photo imageable dielectric (PID).

10. The method of claim 9, wherein a diameter of the sacrificial layer is less than a diameter of the carrier substrate,
wherein a diameter of the redistribution wiring layer is less than the diameter of the sacrificial layer, and
wherein a diameter of the mold layer is greater than the diameter of the redistribution wiring layer and less than the diameter of the sacrificial layer.

11. The method of claim 9, wherein the wafer level stack comprises a first stepped surface corresponding to an exposed upper surface of the carrier substrate and a second stepped surface corresponding to an exposed upper surface of the sacrificial layer, the second stepped surface having a height difference with respect to the first stepped surface.

12. The method of claim 11, wherein a height of the second stepped surface is higher than a height of the first stepped surface.

13. The method of claim 11, wherein each of the first stepped surface and the second stepped has a ring shape in a top view.

14. The method of claim 11, wherein the wafer level stack comprises a plurality of package structures respectively comprising at least one of the plurality of semiconductor chips, and
wherein the plurality of package structures each comprise:
an outer package structure provided adjacent to an edge of the wafer level stack, the outer package structure comprising an outer mold layer comprising a lower surface having a height difference in the mold layer; and
an inner package structure comprising an inner mold layer comprising a flat lower surface in the mold layer, and
the outer package structure comprises the first stepped surface and the second stepped surface.

15. A method of manufacturing a semiconductor package, the method comprising:

providing a carrier substrate having a circular plate shape;
providing a sacrificial layer on the carrier substrate;
providing a redistribution wiring layer on the sacrificial layer;
providing a plurality of semiconductor chips on the redistribution wiring layer;
providing a mold layer provided on the plurality of semiconductor chips on the carrier substrate to form a wafer level stack;
removing the sacrificial layer and the carrier substrate from the wafer level stack to expose a lower surface of the redistribution wiring layer; and
dicing the wafer level stack to form the semiconductor package comprising at least one of the plurality of semiconductor chips,
wherein the sacrificial layer comprises a release layer and a barrier layer sequentially stacked,
wherein the redistribution wiring layer comprises a conductive layer electrically connected to the semiconductor package and an insulation layer provided on the conductive layer,
wherein the conductive layer comprises a lower pad provided on an upper surface of the sacrificial layer, a wiring layer provided on the lower pad, and a via connecting the lower pad to the wiring layer,
wherein the mold layer contacts an upper surface of the redistribution wiring layer, an outer side surface of the redistribution wiring layer, and a portion of the upper surface of the sacrificial layer,
wherein the wafer level stack has a cross-sectional surface having a stepped shape,
wherein a shortest distance between an outer side surface of the mold layer and an outer side surface of the carrier substrate is greater than a shortest distance between an outer side surface of the sacrificial layer and the outer side surface of the carrier substrate, and
wherein the providing of the release layer comprises providing a release film on the carrier substrate and removing an edge of the release film to expose an upper surface of an edge of the carrier substrate.

16. The method of claim 15, wherein the shortest distance between the outer side surface of the mold layer and the outer side surface of the carrier substrate is less than a shortest distance between an outer side surface of the redistribution wiring layer and the outer side surface of the carrier substrate.

17. The method of claim 15, wherein a shortest distance between an outer side surface of the release layer and the outer side surface of the carrier substrate is less than a distance between an outer side surface of the barrier layer and the outer side surface of the carrier substrate.

18. The method of claim 17, wherein the shortest distance between an outer side surface of the mold layer and the outer side surface of the carrier substrate is greater than the distance between the outer side surface of the barrier layer and the outer side surface of the carrier substrate.

19. The method of claim 17, wherein the shortest distance between the outer side surface of the mold layer and the outer side surface of the carrier substrate is greater than the shortest distance between an outer side of the release layer and the outer side surface of the carrier substrate and less than the distance between the outer side surface of the barrier layer and the outer side surface of the carrier substrate.

* * * * *